United States Patent
Aikawa et al.

(10) Patent No.: US 7,145,405 B2
(45) Date of Patent: Dec. 5, 2006

(54) PLANAR HIGH FREQUENCY OSCILLATOR

(75) Inventors: Masayoshi Aikawa, Saga (JP); Takayuki Tanaka, Saga (JP); Fumio Asamura, Saitama (JP); Takeo Oita, Saitama (JP)

(73) Assignees: Nihon Dempa Kogyo Co., Ltd., Tokyo (JP); Saga University, Saga (JP)

( * ) Notice: Subject to any disclaimer, the term of this patent is extended or adjusted under 35 U.S.C. 154(b) by 51 days.

(21) Appl. No.: 11/046,516

(22) Filed: Jan. 28, 2005

(65) Prior Publication Data
US 2005/0184817 A1 Aug. 25, 2005

(30) Foreign Application Priority Data
Jan. 28, 2004 (JP) ............... 2004-020582

(51) Int. Cl.
*H03B 7/12* (2006.01)

(52) U.S. Cl. .............. 331/96; 331/56; 331/107 DP; 331/107 P; 331/107 SL; 331/117 D

(58) Field of Classification Search ............ 331/96, 331/56, 107 P, 107 DP, 107 SL, 117 D
See application file for complete search history.

(56) References Cited

U.S. PATENT DOCUMENTS

| | | | |
|---|---|---|---|
| 6,050,945 A | * | 4/2000 | Peterson et al. ......... 600/443 |
| 6,392,464 B1 | * | 5/2002 | Tiemann ................. 327/317 |
| 6,703,904 B1 | | 3/2004 | Aikawa |
| 2003/0098746 A1 | * | 5/2003 | Aikawa et al. ............ 331/56 |

FOREIGN PATENT DOCUMENTS

JP 2004-096693 3/2004

* cited by examiner

*Primary Examiner*—Robert Pascal
*Assistant Examiner*—Levi Gannon
(74) *Attorney, Agent, or Firm*—Muirhead and Saturnelli, LLC

(57) ABSTRACT

A planar harmonic high frequency oscillator comprises a pair of amplifiers for oscillation, a micro-strip line for connecting between inputs of the pair of amplifiers and between outputs of the amplifiers, a slot line disposed between the inputs and the outputs of the pair of the amplifiers for electromagnetically coupling with the micro-strip line, an output line connected to the micro-strip line at a position at which the micro-strip line traverses the slot line between the inputs or outputs of the pair of amplifiers, and an electronic device for connecting conductors on both sides of the slot line, and for controlling an electromagnetic wave field of the slot line in response to a control signal applied thereto. Two oscillation systems which oscillate in opposite phases with respect to the fundamental wave of oscillation are formed to generate an even-order harmonic of the fundamental wave.

19 Claims, 3 Drawing Sheets

PLANAR HIGH FREQUENCY OSCILLATOR

BACKGROUND OF THE INVENTION

1. Field of the Invention

The present invention relates to a planar higher-harmonic high frequency oscillator for generating even-order harmonics of the fundamental wave such as a second harmonic, a fourth harmonic and the like through so-called push-push oscillation, and more particularly, to a multi-functional planar harmonic high frequency oscillator.

2. Description of the Related Art

An oscillator based on push-push oscillation is known as suitable for generating oscillation signals in a millimeter wave band and a microwave band. The oscillator based on push-push oscillation employs a pair of oscillation circuits which operate at the same fundamental frequency but at opposite phases to each other, and combines the outputs from these oscillation circuits to cancel out the fundamental wave components and extract even-order harmonic components to the outside. In such push-push oscillators, a planar harmonic oscillator, which has oscillation circuits each comprised of a resonant circuit made up of a planar circuit and an amplifier for oscillation, is used in a variety of applications because of its ability to generate output frequencies twice or more as high as fundamental wave f0 in a simple configuration. A planar harmonic oscillator using push-push oscillation is useful, for example, as an oscillation source for a high frequency network which operates, for example, in association with fiber-optic cables, or as an oscillation source for measuring devices. The present inventors have proposed, for example, in Japanese laid-open patent publication No. 2004-96693 (JP, P2004-96693A), a planar harmonic oscillator which is further reduced in size to facilitate its design and generates, for example, even-order harmonics of second harmonic wave 2f0 or higher with respect to fundamental wave f0.

FIG. 1A is a plan view illustrating the configuration of a conventional planar harmonic oscillator which employs injection synchronization for generating a frequency component twice as high as a fundamental wave, i.e., a second harmonic component, and FIG. 1B is a cross-sectional view taken along a line A—A in FIG. 1A.

The planar second-harmonic oscillator generally comprises a pair of amplifiers 1a, 1b for oscillation; micro-strip line 2 which serves as a high frequency transmission line within oscillation systems; and slot line 3 for coupling. Slot line 3 causes the two oscillation systems to oscillate in opposite phases to each other.

Micro-strip line 2 for oscillation is made up of signal line 2A routed on one principal surface of dielectric substrate 4, and ground conductor 5 formed substantially over the entirety of the other principal surface of dielectric substrate 4. Here, micro-strip line 2 is formed in a closed loop substantially in a rectangular shape.

The pair of amplifiers 1a, 1b for oscillation, each comprised of an FET (Field Effect Transistor) or the like, have their output terminals disposed on the one principal surface of dielectric substrate 4 to be opposite to each other, and are inserted in micro-strip line 2. In this way, micro-strip line 2 connects input terminals of the pair of amplifiers 1a, 1b for oscillation to each other, and the output terminals of the same to each other.

Slot line 3 is implemented by aperture line 3A formed in ground conductor 5 on the other principal surface of substrate 4, and is routed to vertically traverse two sections in central portions of micro-strip line 2 which is routed on the one principal surface of substrate 4. Slot line 3 extends in the vertical direction by $\lambda/4$ respectively from the sections of micro-strip line 2 which are traversed by slot line 3, where $\lambda$ represents the wavelength corresponding to an oscillation frequency (i.e., fundamental wave f0), later described. Output line 6, superimposed on slot line 3, is connected to the center of a portion of micro-strip line 2 (the upper side in the figure) which connects the outputs of the pair of amplifiers 1a, 1b for oscillation. Output line 6 is routed on the one principal surface of substrate 4.

In the foregoing oscillator, micro-strip line 2 is electromagnetically coupled to slot line 3 to form two oscillation systems, as shown in the left and right halves of the figures. In this configuration, a high frequency signal in an unbalanced propagation mode, which propagates through micro-strip line 2, is converted into a balanced propagation mode of slot line 3. Since the balanced propagation mode of slot line 3 involves a propagation which has opposite phases at both sides of aperture line 3A, eventually causing the two oscillation systems to oscillate in phases opposites to each other. Since the oscillation frequency (fundamental wave f0) in the oscillation systems generally depends on the length of each oscillation closed loop, the oscillation systems are designed such that the respective oscillation systems oscillate at the same oscillation frequency.

In the configuration as described above, at the midpoint of micro-strip line 2 which connects the outputs of the pair of amplifiers 1a, 1b for oscillation to each other, the fundamental wave (f0) component and odd-order harmonic components in the oscillation frequencies are in opposite phases to each other to provide null potential. On the other hand, even-order harmonics of a second harmonic wave or higher are combined for delivery. However, since harmonics of fourth order and more have relatively low levels as compared with the second harmonic, the fundamental wave (f0) component and other higher-harmonics are suppressed to provide second harmonic wave 2f0 on output line 6. Here, if second harmonic 2f0 is also suppressed, fourth harmonic wave 4f0, which has the next highest level, can be extracted through output line 6.

Since slot line 3 is extended by a quarter wavelength relative to fundamental wave f0 from the upper and lower sections of micro-strip line 2, the respective ends of slot line 3 are electrically open ends, viewed from the positions at which slot line 3 traverses micro-strip line 2. Therefore, the oscillation component of fundamental wave f0 is efficiently transmitted to a negative feedback loop through slot line 3, thus increasing the Q value of the oscillator circuit. The length $\lambda/4$, by which slot line 3 is extended, need not be strictly equal to $\lambda/4$ because this may be such a length that permits the ends of slot line 3 to be regarded as electrically open ends.

However, the planar second-harmonic oscillator in the foregoing configuration simply increases the oscillation frequency, but is not designed in full consideration of providing a multi-functional planar oscillator. Specifically, when the aforementioned planar second-harmonic oscillator is used to design, for example, an FSK (frequency shift keying) circuit, only way available therefor is to provide two sets of planar second-harmonic oscillators having two different oscillation outputs f1, f2 which are switched from one to the other with an electronic switch. Also, even when an ASK (amplitude shift keying) circuit is designed, outputs of oscillators are generally turned on/off by an electronic switch in a similar manner. Any of these circuits requires an electronic switch or the like for switching or turning on/off the outputs, and the electronic switches are disposed separately from a planar oscillator, thus resulting in complicated circuit designs.

SUMMARY OF THE INVENTION

It is therefore an object of the present invention to provide a multi-functional planar harmonic high frequency oscillator which is easy to design, and is capable of achieving modulations such as FSK and ASK in a simple configuration.

The object of the present invention is achieved by a planar harmonic high frequency oscillator which includes a pair of amplifiers for oscillation, a high frequency transmission line for connecting inputs of the pair of amplifiers to each other and connecting outputs of the pair of amplifiers to each other, a slot line disposed between the inputs and the outputs of the pair of amplifiers for electromagnetic coupling with the high frequency transmission line, an output line connected to the high frequency transmission line at a position at which the high frequency transmission line traverses the slot line between the inputs or the outputs of the pair of amplifiers, and an electronic device for connecting conductors on both sides of the slot line, and for controlling an electromagnetic wave field of the slot line in accordance with a control signal applied thereto, wherein the pair of amplifiers, the high frequency transmission line, and the slot line form two oscillation systems which oscillate in opposite phases to each other with respect to a fundamental wave of oscillation, for generating an even-order harmonic of the fundamental wave.

In the oscillator described above, an electromagnetic wave field of the slot line changes depending on the control signal, resulting in a change in the electric length of the slot line which causes a change in the fundamental wave, and an associated change in the output frequency which is a harmonic of the fundamental wave. Alternatively, the oscillation is stopped by the control signal. With these strategies, the resulting high frequency oscillator is simple in configuration and easy to design. For example, a direct modulation can be accomplished in the oscillator by using a modulation signal as the control signal. Specifically, the oscillator can accomplish direct modulations based on FSK which performs a modulation with binary frequencies and on ASK which performs a modulation depending on the presence or absence of an oscillation signal. The oscillator according to the present invention is therefore useful for a direct modulation oscillator in digital communications. Also, the oscillator according to the present invention can be applied to a PLL (phase locked loop) circuit and a variable frequency oscillator by using a frequency variable signal for controlling the frequency of the fundamental wave.

In the present invention, a variable reactance device or a switching device, for example, may be used for the electronic device that is applied with the control signal.

When the variable reactance device is used for the electronic device, the electromagnetic wave field changes in accordance with a reactance value indicated by the control signal, causing the oscillation frequency to change. A voltage variable capacitive device, for example, can be used for such a variable reactance device. When the voltage variable capacitive device is used, the electromagnetic wave field can be controlled with the control voltage.

When the switching device is used for the electronic device, the electromagnetic wave field or electromagnetic field in the slot line is shut off or maintained in response to ON (conduction state) or OFF (shut-off state) of the switching device, as instructed by the control signal. Specifically, when the switching device is turned ON, the conductors on both sides of the slot line in a region in which the switching device is disposed is short-circuited (i.e., made conductive) to block an electromagnetic field which propagates the slot line, causing each oscillation system to form an open loop, thereby stopping the oscillation. On the other hand, when the switching device is turned OFF, the conductors on both sides of the slot line are opened to maintain the slot line, causing each oscillation system to form a closed loop to maintain the oscillation.

Preferably, in the present invention, the amplifiers are mounted on one principal surface of a dielectric substrate, while a ground conductor is disposed on the other principal surface of the dielectric substrate, such that the slot line is formed in the ground conductor. In this structure, a signal line is preferably routed on the one principal surface of the dielectric substrate for connection between the inputs of the pair of amplifier and connection between the outputs of the pair of amplifiers to make the high frequency transmission line in micro-strip line structure.

DETAILED DESCRIPTION OF THE PREFERRED EMBODIMENTS

Figure 1A:
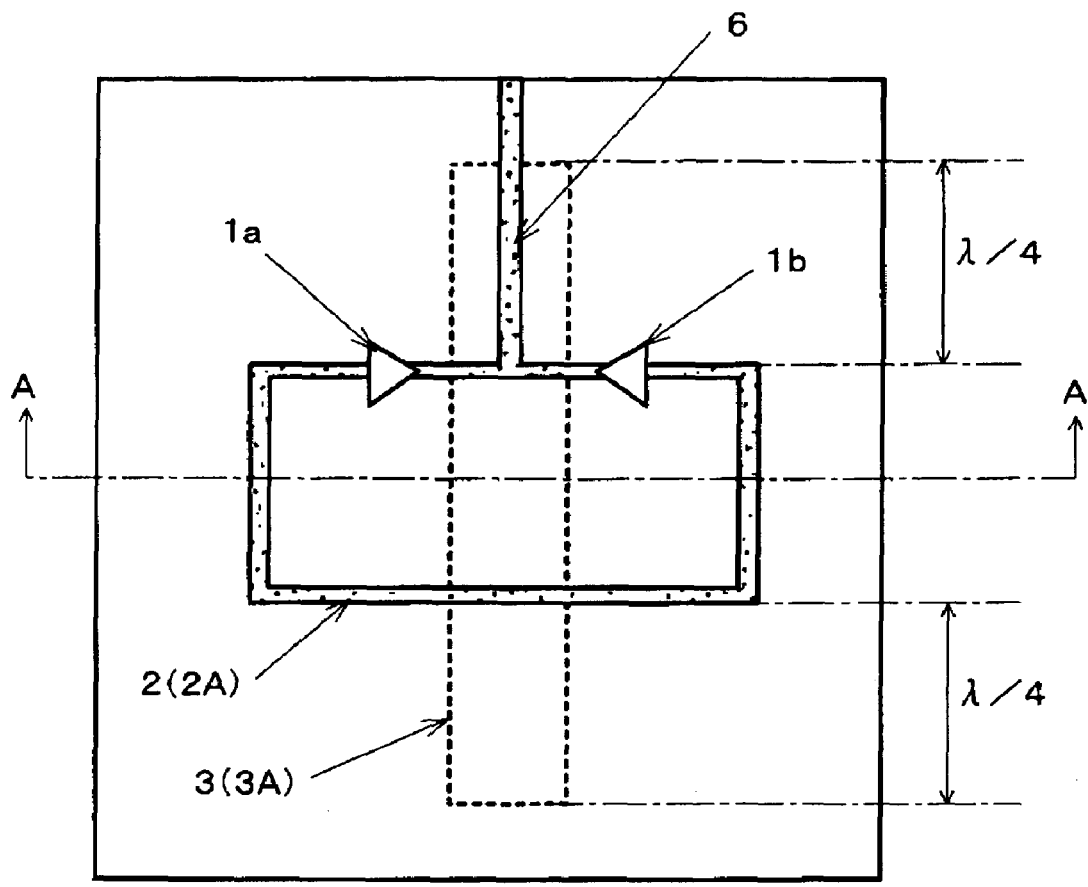
FIG. 1A is a plan view illustrating the configuration of a conventional planar harmonic oscillator which employs injection synchronization for generating a second harmonic, i.e., frequency component twice as high as a fundamental wave.
Figure 1B:
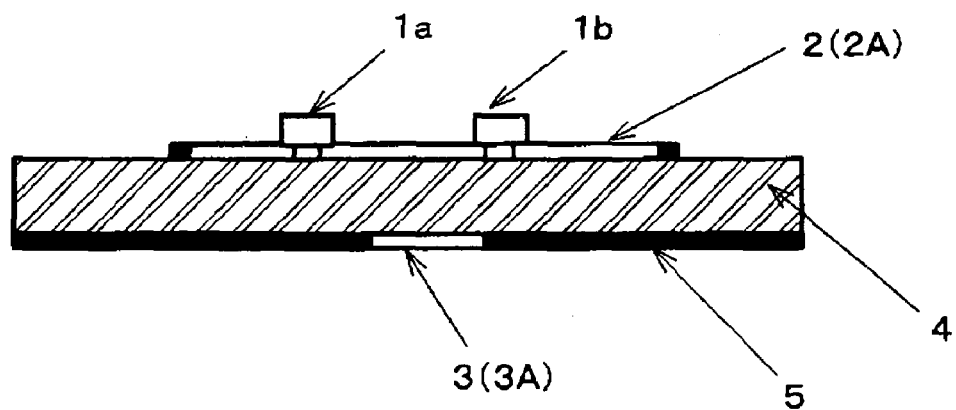
FIG. 1B is a cross-sectional view taken along a line A—A in FIG. 1A.
Figure 2A:
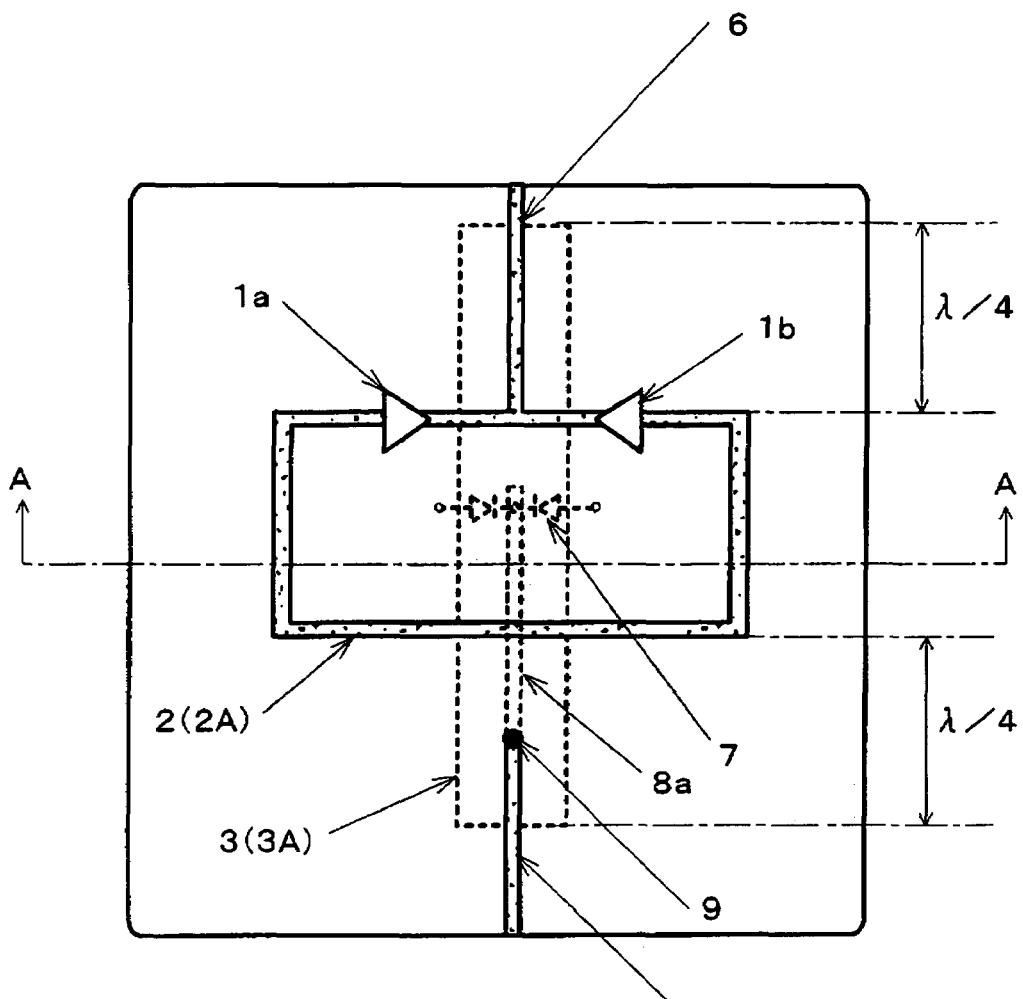
FIG. 2A is a plan view illustrating the configuration of a planar second-harmonic high frequency oscillator according to one embodiment of the present invention.
Figure 2B:
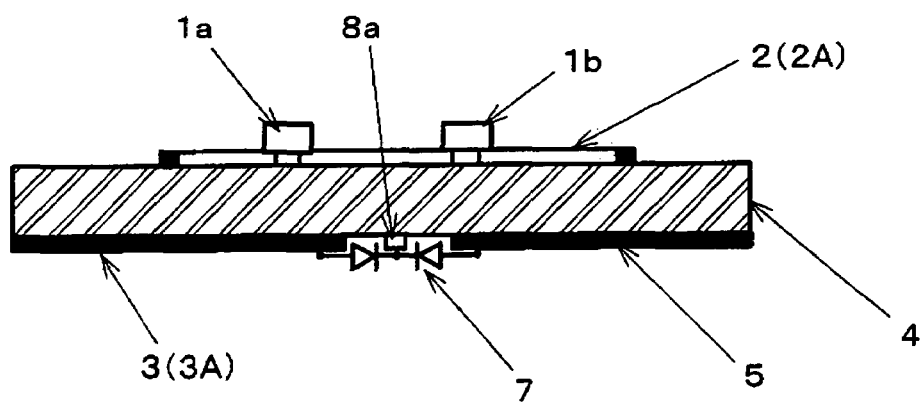
FIG. 2B is a cross-sectional view taken along a line A—A in FIG. 2A.

A planar second-harmonic high frequency oscillator according to a preferred embodiment of the present invention illustrated in FIGS. 2A and 2B additionally includes an electronic device for controlling a wave electromagnetic field of the slot line in accordance with a control signal in the oscillator illustrated in FIGS. 1A and 1B. In FIGS. 2A and 2B, components identical to those in FIGS. 1A and 1B are designated the same reference numerals, and repeated description thereon is simplified.

The planar second-harmonic oscillator illustrated in FIGS. 2A and 2B, like the one illustrated in FIGS. 1A and 1B, comprises a pair of amplifiers 1a, 1b for oscillation; micro-strip line 2 having output line 6 as a high frequency transmission line; slot line 3 for providing opposite-phase oscillations; and dielectric substrate 4. Electronic device 7 for controlling the electromagnetic wave field of slot line 3 is disposed in a central region of slot line 3 routed on the other principal surface of substrate 4. Here, electronic device 7 is a variable reactance device, and specifically comprised of a pair of varactor diodes which change their capacitances in accordance with a voltage applied thereto.

The pair of varactor diodes, which are connected in opposite polarity configuration, are disposed within slot line 3. For example, the pair of varactor diodes have their cathodes connected to each other, and anodes connected to conductors on both sides of aperture line 3A of slot line 3, respectively. Then, first signal line 8a is connected to the connection (i.e., common cathodes) of the pair of varactor diodes. The first signal line 8a is disposed on the one principal surface of substrate in aperture line 3A and extends along the longitudinal direction of aperture line 3A. First signal line 8a is also connected to second signal line 8b, routed on the other principal surface of substrate 4, through via hole 9 within slot line 3. Second signal line 8b is supplied at the other terminal, for example, with a binary voltage signal for FSK modulation.

In the foregoing configuration, as an FSK modulation signal is supplied to second signal line 8b, the capacitance value varies between the terminals in the pair of varactor diodes based on the voltage level of the modulation signal. This causes a change in an electromagnetic boundary condition of slot line 3 to lead variations in the electromagnetic wave field, resulting in a change in the substantial electric length of slot line 3. Therefore, each oscillation closed loop for determining the oscillation frequency also changes in electric length. From the foregoing, the oscillation frequency of the fundamental wave directly changes to f10 or to f20 depending on the binary modulation signal, with the result that the frequency of the second harmonic also changes to 2f10 or to 2f20. In this event, fundamental waves f10 or f20 directly modulated in FSK are in opposite phases between the two oscillation systems at the midpoint of micro-strip line 2 at which output line 6 is connected, so that the fundamental wave has a null potential at the midpoint. As a result, the second harmonic 2f10 or 2f20 is generated and delivered from output line 6 in accordance with a control signal. In this way, this embodiment provides a planar second-harmonic oscillator for FSK-based direct modulation which is simple in construction and easy to design.

In the foregoing example, the control signal is a binary modulation signal for FSK, but may be instead an analog modulation signal. Further, not limited to the modulation signal, an analog control signal may be applied, in which case the resulting planar second-harmonic oscillator is a voltage-controlled type one which can be used for a PLL or a frequency variable planar oscillator.

In this embodiment, electronic device 7 used herein may be a switching device other than the variable reactance device. The following description will be made on a planar second-harmonic oscillator which employs a switching device.

The switching device, which implements the electronic device, is comprised of a pair of switching diodes which are disposed within slot line 3 in opposite polarity connection, similar to the foregoing, and connected to ground conductors 5 on both sides of slot line 3. For example, the switching diodes have their cathodes connected to each other, and anodes connected to the ground conductors located nearby. Then, second signal line 8b is connected to a connection of the pair of switching diodes through first signal line 8a and via hole 9. Here, second signal line 8b is supplied, for example, with a binary voltage signal for ASK modulation.

In this configuration, as the ASK modulation signal is supplied to second signal line 8b, the pair of switching diodes turn ON (i.e., conduction state) or OFF (shut-off state) based on the voltage level of the modulation signal. When the switching diodes are turned ON, ground conductors 5 on both sides of slot line 3 electrically short-circuits to each other at the position at which the switching diodes are connected, so that slot line 3 is blocked at this position. Consequently, each oscillation system forms an open loop to stop oscillating. On the other hand, when the switching diodes are turned OFF, slot line 3 is maintained as it is because the conductors on both sides of slot line 3 are not connected. As such, each oscillation system forms a closed loop to maintain the oscillation.

In this oscillator, fundamental wave components f0 of the oscillation frequency are in opposite phases to each other and at null potential at the connection point of output line 6, and second harmonic 2f0 is generated.

In this way, when switching devices such as switching diodes are used for the electronic device, the oscillation is stopped or maintained in accordance with a modulation signal, thereby providing a planar second-harmonic oscillator of direct modulation type for ASK. Further, this oscillator is not limited to the ASK application but may also be applied to an intermittent oscillator.

Figure 3:
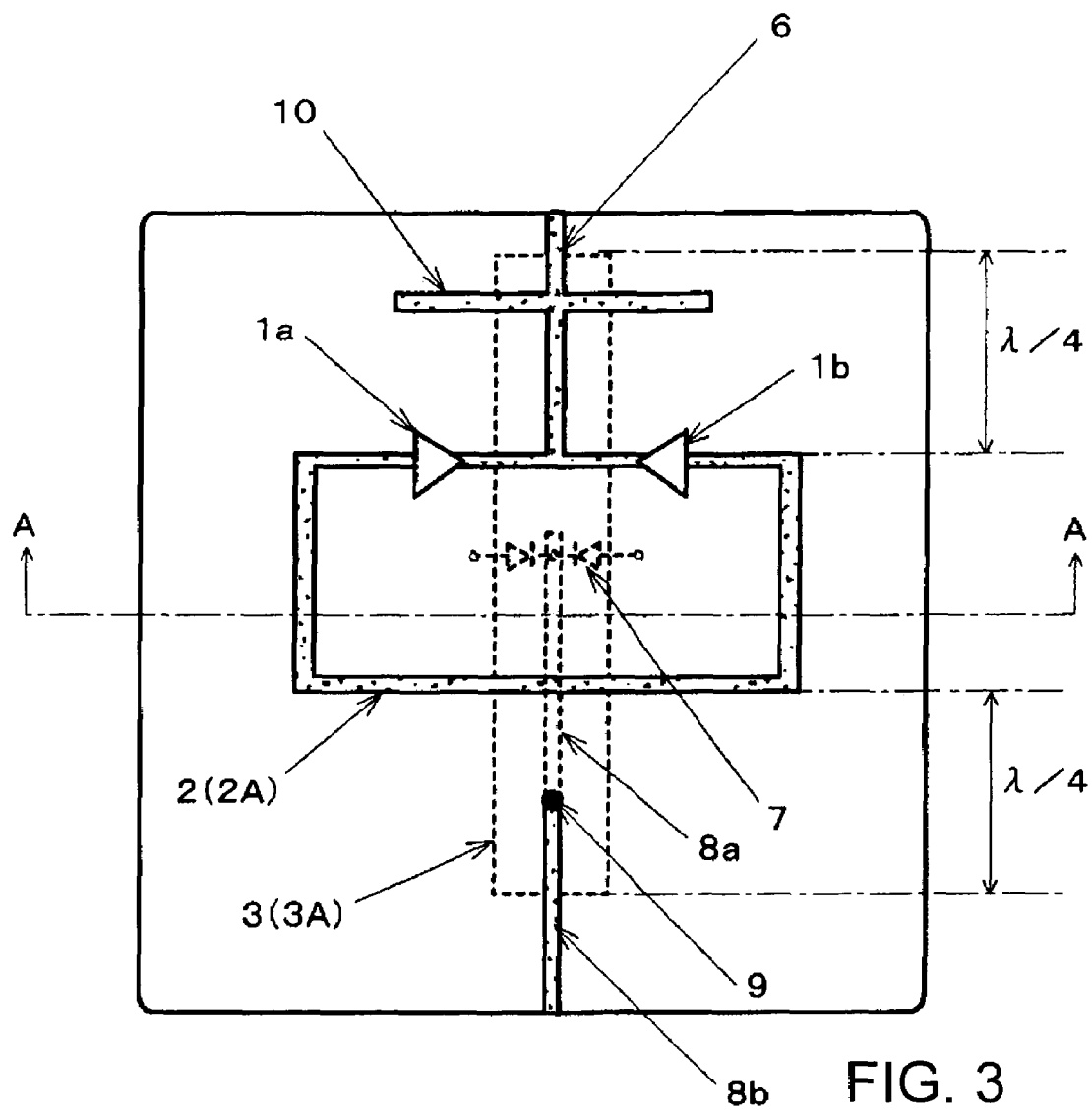
FIG. 3 is a plan view illustrating another planar second-harmonic high frequency oscillator according to the present invention.

While the planar harmonic oscillator described above is a planar second-harmonic oscillator for generating a second harmonic component, a planar fourth-harmonic oscillator can be provided for generating frequency 4f0 four times higher than fundamental wave f0 when a filter is disposed in the planar second-harmonic oscillator for suppressing the second harmonic component wave at the output. FIG. 3 illustrates such a planar fourth-harmonic oscillator.

The planar fourth-harmonic oscillator illustrated in FIG. 3 additionally includes micro-strip line 10 for filtering second harmonic component 2f0, extending from output line 6 on one or both sides thereof in the planar second-harmonic oscillator illustrated in FIGS. 2A and 2B. This micro-strip line 10 approximately has a length of one quarter of the wavelength of second harmonic 2f0, and has open leading ends. Micro-strip line 10 approximately has a length of $\lambda/8$, where $\lambda$ represents the wavelength corresponding to fundamental wave f0.

By setting the length of micro-strip line 10 in the foregoing manner, micro-strip line 10 functions to be an electrically short-circuit end for the second harmonic component, when viewed from the connection of micro-strip line 10 with output line 6, causing second harmonic 2f0 to flow into the electric short-circuit end. Consequently, the fourth harmonic component wave 4f0, which has the highest level except for the second harmonic component, is generated at the output terminal of output line 6.

Likewise, eighth harmonic 8f0 is generated when a filter for filtering the fourth harmonic component is additionally disposed on output line 6.

While the preferred embodiments of the present invention has been described above, the high frequency transmission line for connecting between the inputs of the pair of amplifiers for oscillation and connecting between the outputs of the pair of amplifiers may be a coplanar line or a combination of a coplanar line and a micro-strip line, which may be substituted for the aforementioned micro-strip line 2.

Since the planar harmonic oscillators as shown in the foregoing embodiments are configured in a planar circuit using dielectric substrate 4, the planar harmonic oscillator can be readily incorporated into MMIC (Monolithic Microwave Integrated Circuit), and therefore has a particularly advantage in reducing the size.

What is claimed is:

1. A planar harmonic high frequency oscillator, comprising:
   a pair of amplifiers for oscillation;
   a high frequency transmission line for connecting inputs of said pair of amplifiers to each other and connecting outputs of said pair of amplifiers to each other;
   a slot line disposed between the inputs and the outputs of said pair of amplifiers for electromagnetic coupling with said high frequency transmission line, said high frequency transmission line traversing said slot line at two positions between the inputs of said pair of amplifiers and between the outputs of said pair of amplifiers;

an output line connected to said high frequency transmission line at one of said two positions; and an electronic device for connecting conductors on both sides of said slot line, and for controlling an electromagnetic wave field of said slot line in accordance with a control signal applied thereto, wherein said electronic device is arranged between said two positions, and wherein said pair of amplifiers, said high frequency transmission line, and said slot line form two oscillation systems which oscillate in opposite phases to each other with respect to a fundamental wave of oscillation, for generating an even-order harmonic of said fundamental wave.

2. The oscillator according to claim 1, wherein said electronic device is a variable reactance device.

3. The oscillator according to claim 2, wherein said variable reactance device is a voltage variable capacitive device.

4. The oscillator according to claim 3, wherein said voltage variable capacitive device comprises a pair of varactor diodes in opposite polarity connection, wherein said control signal is applied to a connection of said pair of varactor diodes.

5. The oscillator according to claim 1, wherein said control signal is a modulation signal.

6. The oscillator according to claim 5, wherein said modulation signal is a modulation signal for frequency shift keying.

7. The oscillator according to claim 1, wherein said control signal is a frequency variable signal for controlling a frequency of said fundamental wave.

8. The oscillator according to claim 1, wherein said electronic device is a switching device.

9. The oscillator according to claim 8, wherein said switching device is a switching diode.

10. The oscillator according to claim 8, wherein said switching device comprises a pair of switching diodes in opposite polarity connection, wherein said control signal is applied to a connection of said pair of switching diodes.

11. The oscillator according to claim 1, wherein said control signal is a modulation signal for amplitude shift keying.

12. The oscillator according to claim 8, wherein said control signal is a modulation signal for amplitude shift keying.

13. The oscillator according to claim 1, wherein said high frequency transmission line is a micro-strip line.

14. The oscillator according to claim 1, further comprising a dielectric substrate, wherein said amplifiers are mounted on one principal surface of said dielectric substrate, a ground conductor is disposed on the other principal surface of said dielectric substrate, and said slot line is formed in said ground conductor.

15. The oscillator according to claim 14, wherein said high frequency transmission line is a micro-strip line.

16. The oscillator according to claim 1, wherein said even-order harmonic is a second harmonic.

17. The oscillator according to claim 1, wherein said even-order harmonic is a fourth harmonic.

18. The oscillator according to claim 4, further comprising:
a signal line disposed inside the slot line and extending along a longitudinal direction of the slot line.

19. The oscillator according to claim 10, further comprising:
a signal line disposed inside the slot line and extending along a longitudinal direction of the slot line.

* * * * *